(12) United States Patent
Lin et al.

(10) Patent No.: US 8,890,253 B2
(45) Date of Patent: Nov. 18, 2014

(54) SEMICONDUCTOR DEVICE

(75) Inventors: Yung-Fa Lin, Hsinchu (TW); Shou-Yi Hsu, Hsinchu (TW); Meng-Wei Wu, Hsinchu (TW); Yi-Chun Shih, Hsinchu (TW); Main-Gwo Chen, Hsinchu (TW)

(73) Assignee: Anpec Electronics Corporation, Hsinchu (TW)

( * ) Notice: Subject to any disclaimer, the term of this patent is extended or adjusted under 35 U.S.C. 154(b) by 92 days.

(21) Appl. No.: 13/348,961

(22) Filed: Jan. 12, 2012

(65) Prior Publication Data
US 2012/0248540 A1    Oct. 4, 2012

(30) Foreign Application Priority Data
Mar. 30, 2011   (TW) ............................. 100111040 A

(51) Int. Cl.
| H01L 27/088 | (2006.01) |
| H01L 29/78 | (2006.01) |
| H01L 29/417 | (2006.01) |
| H01L 29/06 | (2006.01) |
| H01L 29/40 | (2006.01) |
| H01L 29/10 | (2006.01) |

(52) U.S. Cl.
CPC ....... H01L 29/7811 (2013.01); H01L 29/41766 (2013.01); H01L 29/7808 (2013.01); H01L 29/0661 (2013.01); H01L 29/407 (2013.01); H01L 29/0619 (2013.01); H01L 29/1095 (2013.01); H01L 29/0653 (2013.01)
USPC ............... 257/368; 257/265; 257/E29.131; 257/E29.133

(58) Field of Classification Search
USPC ............... 257/E29.021, 330, E29.257, 341, 257/E29.262, 328, E29.027, E29.066, 257/E21.41, 329, E29.256, E29.133, 331, 257/265, E29.131, 368; 438/270, 268, 286, 438/589
See application file for complete search history.

(56) References Cited
U.S. PATENT DOCUMENTS
2008/0138953 A1 *   6/2008   Challa et al. .................. 438/270
* cited by examiner

*Primary Examiner* — Ermias Woldegeorgis
(74) *Attorney, Agent, or Firm* — Stroock & Stroock & Lavan LLP

(57) ABSTRACT

A semiconductor device includes: a substrate including a first epitaxial layer that has a first electrical type, and a second epitaxial layer; a transistor that includes a source region and an insulating spacer; an inner surrounding structure including an annular trench and an insulating spacer; an outer surrounding structure that has a second electrical type opposite to the first electrical type, and that is disposed adjacent to an upper surface of the second epitaxial layer to surround and contact the inner surrounding structure; and a conductive structure connecting to the source region, and the inner and outer surrounding structures.

10 Claims, 3 Drawing Sheets

SEMICONDUCTOR DEVICE

CROSS-REFERENCE TO RELATED APPLICATION

This application claims priority of Taiwanese application no. 100111040, filed on Mar. 30, 2011.

BACKGROUND OF THE INVENTION

1. Field of the Invention

The present invention relates to a semiconductor device, and more particularly to a semiconductor device having a surrounding structure.

2. Description of the Related Art

Referring to FIG. 1, a conventional semiconductor device has a substrate 11 that is made of a semiconductor material, a plurality of transistors 12, and a conductive structure 13.

The substrate 11 includes a first epitaxial layer 111 that has a first electrical type, and a second epitaxial layer 112 that is formed on the first epitaxial layer 111 and that has a majority carrier concentration less than that of the first epitaxial layer 111. The first epitaxial layer 111 is formed as a conductor due to a higher majority carrier concentration thereof.

Each of the transistors 12 includes a well region 123 that is formed in the second epitaxial layer 112 and that has a second electrical type opposite to the first electrical type, a source region 121 that has the first electrical type and that is formed in the well region 123, and a gate structure 122 that is formed on the second epitaxial layer 112. The gate structure 122 includes a dielectric layer 124 that is formed on the second epitaxial layer 112, and a conductive layer 125 that is formed on the dielectric layer 124 and that is spaced apart from the second epitaxial layer 112 and the source region 121.

The conductive structure 13 is made of a metal material so as to exhibit a conductive property, and includes a plurality of conductive structure regions 131 that are known as contacts in the art and that cover and contact the source regions 121. In general, because the transistors 12 are arranged to be spaced apart from one another, and the first epitaxial layer 111 of the substrate 11 is a continuous layer, the plurality of conductive structure regions 131 of the conductive structure 13 are substantially connected to one another.

The first epitaxial layer 111 of the substrate 11 serves as a drain, the well region 123 serves as a well, the source region 121 serves as a source, and the gate structure 122 serves as a gate. In addition, the transistors 12 are connected in parallel to one another through the first epitaxial layer 111 of the substrate 11 and the conductive structure regions 131.

When a predetermined voltage is applied to the first epitaxial layer 111 of the substrate 11 and the conductive layer 125 of the gate structure 122, and the conductive structure 13 is grounded (i.e., the source region 121 is 0 volt), the voltage from the first epitaxial layer 111 allows the well region 123 to form a channel so that current from the substrate 11 passes through the channel to the source region 121, thereby actuating the power transistor. All of the transistors 12 of the semiconductor device are connected in parallel so that the currents of the transistors 12 are collected.

A disadvantage of the conventional semiconductor device is that, if the predetermined voltage applied at the drain is too large, the dielectric layer 124 of the gate structure 122 of the transistors 12 may not be able to withstand the high voltage and break down. In addition, because the transistors 12 are parallelly connected, the breakdown of one of the transistors 12 may make all of the transistors 12 unable to operate normally, thereby leading to permanent failure of the semiconductor device.

SUMMARY OF THE INVENTION

Therefore, the object of the present invention is to provide a semiconductor device that can overcome the aforesaid drawback associated with the prior art.

Accordingly, a semiconductor device of the present invention comprises:

a substrate including a first epitaxial layer that has a first electrical type, and a second epitaxial layer that has a majority carrier concentration less than that of the first epitaxial layer, and that has an upper surface opposite to the first epitaxial layer;

a transistor that is formed above the first epitaxial layer, and that includes a source region disposed underneath the upper surface of the second epitaxial layer and away from the first epitaxial layer;

an inner surrounding structure including an annular trench that is defined by a trench-defining wall and indented annularly from the upper surface of the second epitaxial layer toward the first epitaxial layer in a longitudinal direction to surround the transistor, and an insulating spacer that is formed on and entirely contact the trench-defining wall;

an outer surrounding structure that has a second electrical type opposite to the first electrical type, that disposed adjacent to the upper surface of the second epitaxial layer to surround and contact the inner surrounding structure, and that is spaced apart from the transistor by the inner surrounding structure; and a conductive structure connecting to the source region, and the inner and outer surrounding structures.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
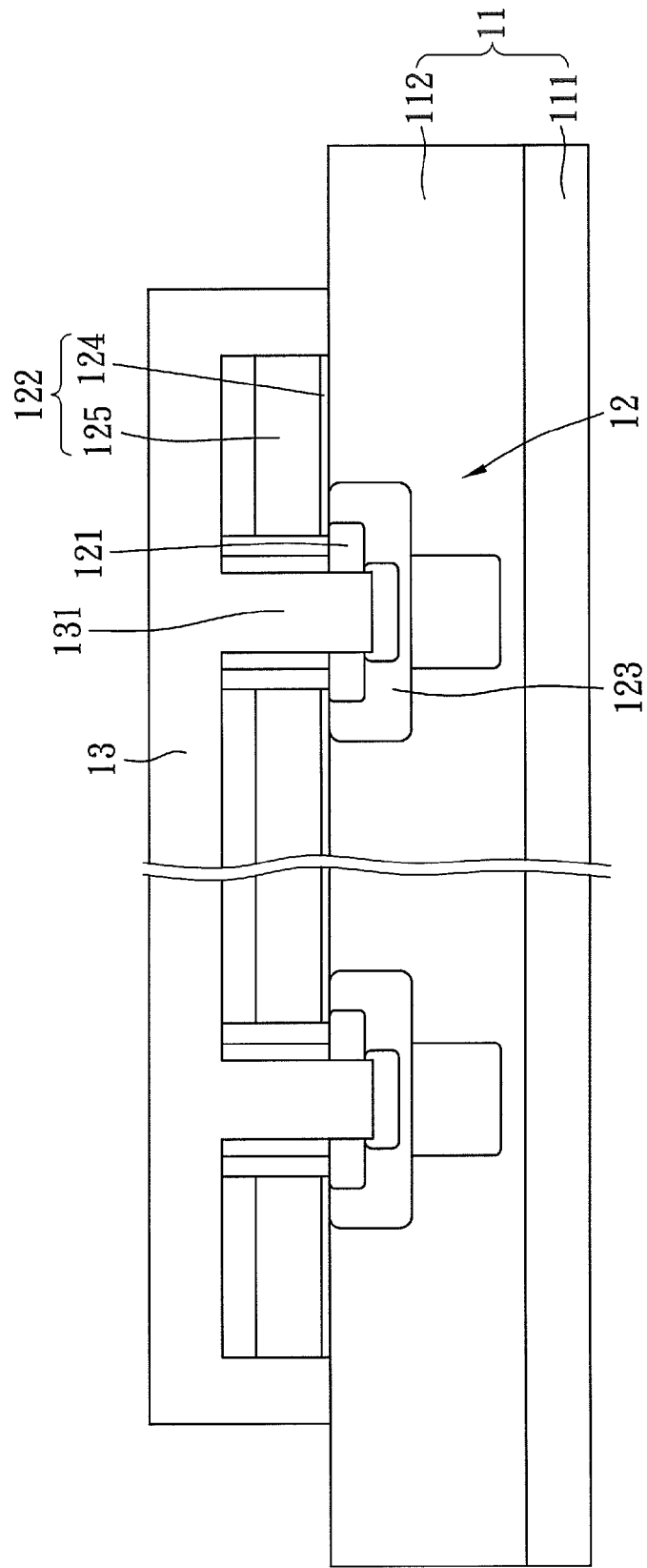
FIG. 1 is a fragmentary schematic diagram of a conventional semiconductor device.

Before the present invention is described in greater detail, it should be noted that like components are assigned the same reference numerals throughout the following disclosure.

Figure 2:
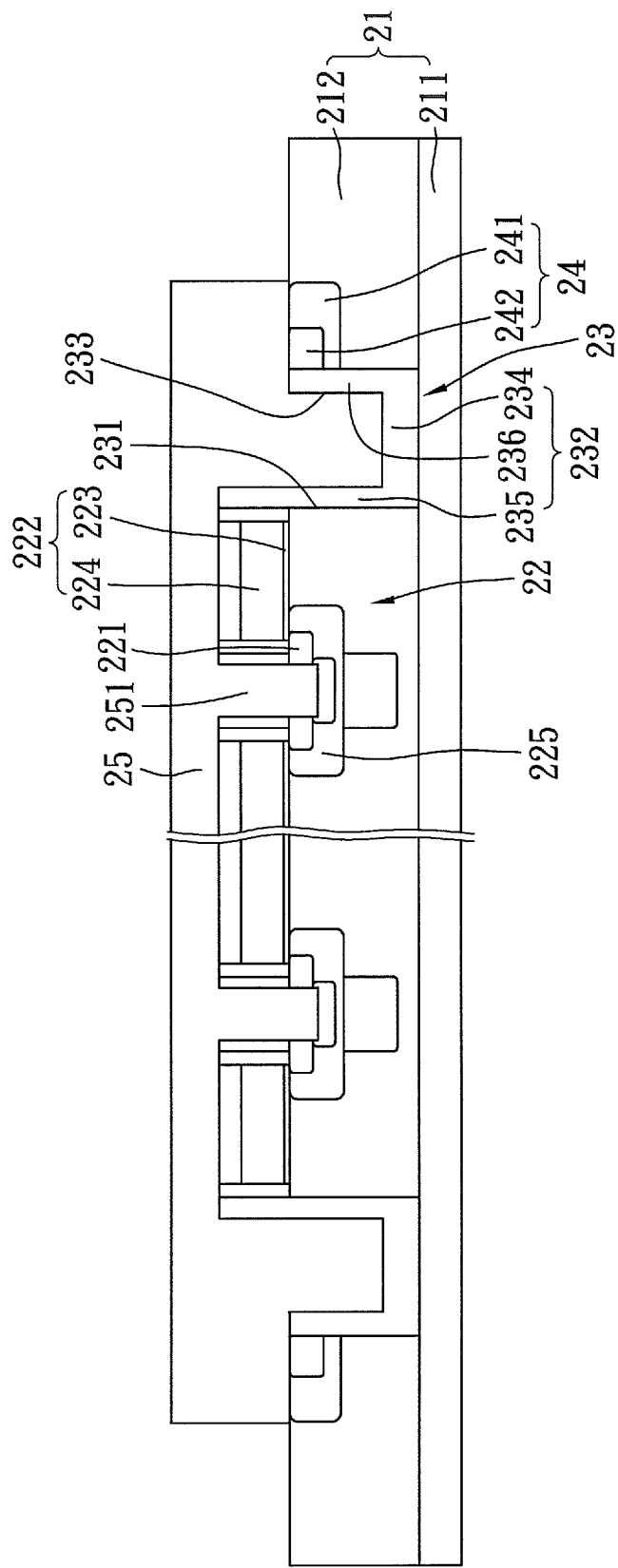
FIG. 2 is a fragmentary schematic diagram of the preferred embodiment of a semiconductor device according to the present invention.

Referring to FIG. 2, the preferred embodiment of a semiconductor device of the present invention comprises a substrate 21, a plurality of transistors 22, an inner surrounding structure 23, an outer surrounding structure 24, and a conductive structure 25.

The substrate 21 includes a first epitaxial layer 211 that has a first electrical type, and a second epitaxial layer 212 that has a majority carrier concentration less than that of the first epitaxial layer 211, and that has an upper surface opposite to the first epitaxial layer 211. The first epitaxial layer 211 has a greater majority carrier concentration, and can be regarded as a conductor.

Each of the transistors 22 is formed above the first epitaxial layer 211, and includes a well region 225 that is formed in the second epitaxial layer 212 and that has a second electrical type opposite to the first electrical type, a source region 221 that has the first electrical type and that is formed in the second epitaxial layer 212 and is in contact with the well region 225, and a gate structure 222. The source region 221 is disposed underneath the upper surface of the second epitaxial layer 212 and away from the first epitaxial layer 211. The gate structure 222 includes a dielectric layer 223 that is formed on the upper surface of the second epitaxial layer 212, and a conductive layer 224 formed on the dielectric layer 223 oppositely of the second epitaxial layer 212 so that the conductive layer 224 is electrically isolated from the second epitaxial layer 212, the well region 225, and the source region 221 by the dielectric layer 223. The dielectric layer 223 is made of an insulative material, such as silicon dioxide, silicon nitride, etc. The conductive layer 224 is made of a conductive material, such as polycrystalline silicon, metal, etc.

In this preferred embodiment, the first electrical type is n-type, and the second electrical type is p-type. A material for n-type may be, e.g., a semiconductor material containing pentavalent atoms, and a material for p-type may be, e.g., a semiconductor material containing trivalent atoms. Of course, if the first electrical type is p-type, the second electrical type is n-type.

The inner surrounding structure 23 includes an annular trench 231, and an insulating spacer 232. The annular trench 231 is defined by a trench-defining wall and is indented annularly from the upper surface of the second epitaxial layer 212 toward the first epitaxial layer 211 in a longitudinal direction to surround the transistors 22. The depth of the annular trench 231 is not less than the thickness of the second epitaxial layer 212. The insulating spacer 232 is formed on and entirely contacts the trench-defining wall of the annular trench 231. The insulating spacer 232 is made of a material selected from silicon oxide, a material having a relatively low dielectric constant, an insulative material, and combinations thereof. In this embodiment, the insulating spacer 232 is formed with an annular groove 233 that is defined by a groove-defining wall. Accordingly, the insulating spacer 232 is divided into a bottom portion 234 formed on and contacting the first epitaxial layer 211, an inner wall portion 235 that adjoins the transistor 22, and an outer wall portion 236 that is spaced apart from the inner wall portion 235 by the annular groove 233. The inner and outer wall portions 235, 236 parallelly extend from the bottom portion 234 in the longitudinal direction. A thickness of the bottom portion 234 from the trench-defining wall to the groove-defining wall is not less than a thickness of the inner wall portion 235 from the trench-defining wall to the groove-defining wall. Moreover, the thickness of the inner wall portion 235 is greater than a thickness of the dielectric layer 223 in the longitudinal direction.

The outer surrounding structure 24 has a second electrical type opposite to the first electrical type, and is disposed adjacent to the upper surface of the second epitaxial layer 212 to surround and contact the inner surrounding structure 23, and is spaced apart from the transistors 22 by the inner surrounding structure 23. That is, the transistors 22 are surrounded by the inner surrounding structure 23, which is in turn surrounded by the outer surrounding structure 24. The outer surrounding structure 24 includes a first region 241 that has the second electrical type, and a second region 242 that also has the second electrical type and that is formed in and contacts the first region 241. The second region 242 has a majority carrier concentration higher than that of the first region 241. In this regard, the first region 241 having a lower majority carrier concentration is formed before the second region 242 is formed in order to more efficiently control the substantial area of the first region 241 and to prevent the second region 242 with the high majority carrier concentration from being formed outside the outer surrounding structure 24.

Preferably, the outer surrounding structure 24 has a width measured from an interface between the inner surrounding structure 23 and the outer surrounding structure 24 to a side of the outer surrounding structure 24 oppositely of the interface. The width is not less than 1 μm.

More preferably, the outer surrounding structure 24 is spaced apart from a lateral edge of the second epitaxial layer 212 by a distance not less than 2 μm.

The conductive structure 25 connects to the source region 221, and the inner and outer surrounding structures 23, 24. More specifically, the conductive structure 25 is made of a conductive material, such as tungsten, copper, aluminum, etc. The conductive structure 25 includes a plurality of conductive structure regions 251 that are known as contacts in the art and that cover correspondingly the exposed regions that are uncovered by the second epitaxial layer 212 and the well region 225, respectively. In general, although the transistors 22 are arranged spaced apart from one another, the first epitaxial layer 211 of the substrate 11 is a substantially complete and uncut semiconductor material such as a wafer, and the plurality of conductive structure regions 251 of the conductive structure 25 are substantially connected to one another so that the conductive structure 25 can be deemed as a complete block. The conductive structure 25 is also filled in the annular groove 233 of the inner surrounding structure 23, and extends upwardly to cover both of the inner surrounding structure 23 and the outer surrounding structure 24, so that the source regions 221 of the transistors 22, the inner surrounding structure 23, and the outer surrounding structure 24 are connected electrically through the conductive structure 25. In addition, the lateral edge of the conductive structure 25 is spaced from the lateral edge of the second epitaxial layer 212 by a distance not less than 2 μm.

The first epitaxial layer 211 of the substrate 21 serves as a drain, the well region 225 serves as a well, the source region 221 serves as a source, and the conductive structure regions 251 are referred to as contacts.

In addition, since the outer surrounding structure 24 has the second electrical type and the substrate 21 has the first electrical type, the outer surrounding structure 24 and the substrate 21 constitute cooperatively a diode. The insulating spacer 232, the first epitaxial layer 211 that is in contact with the insulating spacer 232, and the conductive structure 25 that is in contact with the insulating spacer 232 constitute cooperatively a structure that isolates the transistors 22 from the outer surrounding structure 24.

Taking the n-type transistor (n-MOSFET) as an example (i.e., the first electrical type is the n-type and the second electrical type is the p-type), when a predetermined positive voltage is applied to the first epitaxial layer 211 of the substrate 21 and the conductive layer 224 of the gate structure 222, respectively, and the conductive structure 25 is grounded (i.e., the source region 221 is 0 volt), the voltage at the first epitaxial layer 211 allows the well region 225 to form a channel so that current from the substrate 21 passes through the channel to the source region 221, thereby actuating the power transistor. All of the transistors 22 of the semiconductor device are connected in parallel so that the currents of the transistors 22 are collected. At this time, the diode formed by the outer surrounding structure 24 and the substrate 21 is subjected to a reverse bias, and the depletion region is larger than the depletion region when the electric power is not supplied so that the electrical charges cannot be transmitted. In addition, since the first epitaxial layer 211 is in contact with the bottom portion 234 of the insulating spacer 232 that has a larger thickness than that of the inner wall portion 235, the bottom portion 234 and the first epitaxial layer 211 form cooperatively an electric structure having a withstand voltage higher than that of the transistors 22, and the inner wall portion 235 of the insulating spacer 232 isolates the transistors 22 from the outer surrounding structure 24. Therefore, the gate structures 222 of the transistors 22 are isolated and electrically insulated from the outer surrounding structure 24 through the inner wall portion 235 of the inner surrounding structure 23.

When the external positive voltage to the first epitaxial layer 211 that serves as the drain is continuously increased to a value greater than the voltage that can be withstood by the diode formed by the outer surrounding structure 24 and the substrate 21, the diode formed by the outer surrounding structure 24 and the substrate 21 breaks down to form a breakdown region. The electrical charges are bypassed to the conductive structure 25 through the outer surrounding structure 24, and finally grounded. Since the outer surrounding structure 24 is isolated from the transistors 22 via the inner surrounding structure 23, the outer surrounding structure 24 in the breakdown state may not damage the transistors 22 that are surrounded by the inner surrounding structure 23 for isolation from the outer surrounding structure 24. Therefore, the transistors 22 may be maintained in a normal operation state.

Figure 3:
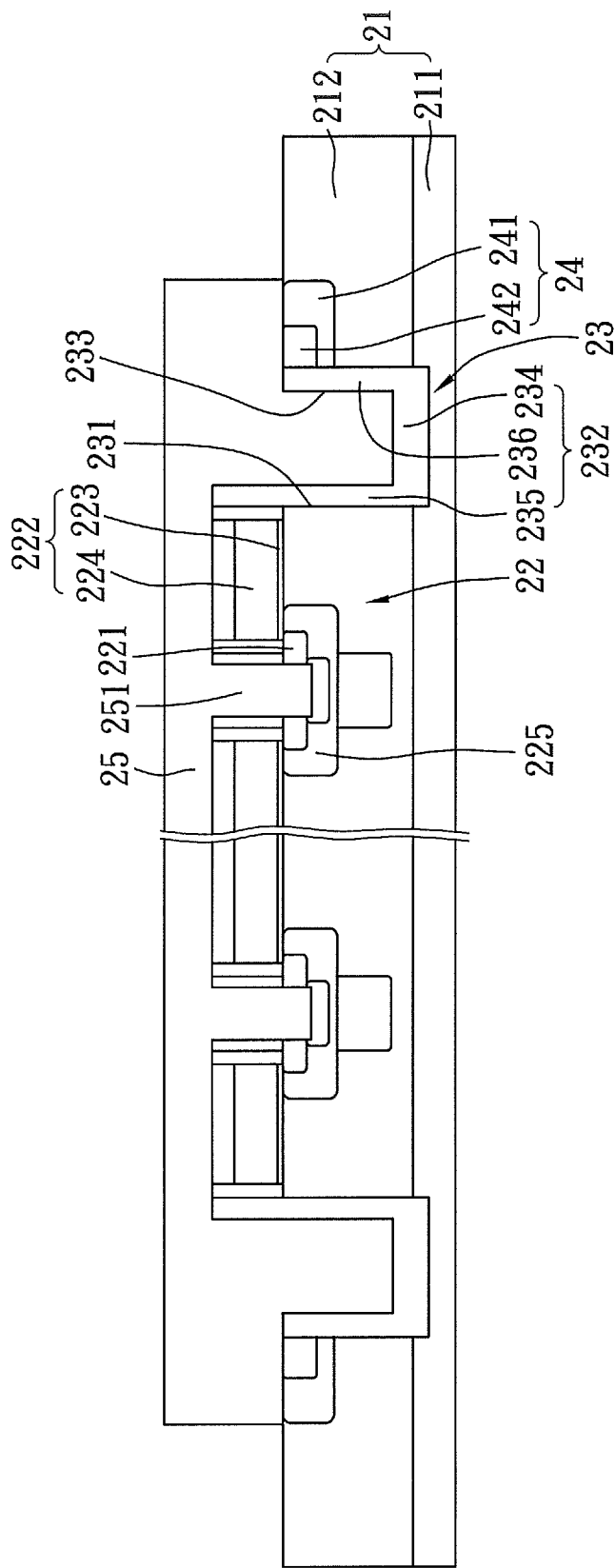
FIG. 3 is a fragmentary schematic diagram of a modification of the preferred embodiment shown in FIG. 2.

Referring to FIG. 3, it is noted that when the inner surrounding structure 23 extends from the upper surface of the second epitaxial layer 212 through the second epitaxial layer 212 and into the first epitaxial layer 211 without penetration through the first epitaxial layer 211, the outer surrounding structure 24 in the breakdown state may similarly be isolated from the transistors 22 through the inner surrounding structure 23.

To sum up, in this invention, by virtue of the outer surrounding structure 24 and the insulating spacer 232 of the inner surrounding structure 23, when excess external voltage that is inputted results in break down of the diode formed by the substrate 21 and the outer surrounding structure 24, the transistors 22 may be protected from damage and could be maintained at a normal operation state.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A semiconductor device, comprising:
    a substrate including a first epitaxial layer that has a first electrical type, and a second epitaxial layer that has a majority carrier concentration less than that of said first epitaxial layer, and that has an upper surface opposite to said first epitaxial layer;
    a transistor that is formed above said first epitaxial layer, and that includes a source region disposed underneath said upper surface of said second epitaxial layer and away from said first epitaxial layer;
    an inner surrounding structure including an annular trench that is defined by a trench-defining wall and indented annularly from said upper surface of said second epitaxial layer toward said first epitaxial layer in a longitudinal direction to surround said transistor, and an insulating spacer that is formed on and entirely contacts said trench-defining wall;
    an outer surrounding structure that has a second electrical type opposite to said first electrical type, that is disposed adjacent to said upper surface of said second epitaxial layer to surround and contact said inner surrounding structure, and that is spaced apart from said transistor by said inner surrounding structure; and
    a conductive structure connecting to said source region, and said inner and outer surrounding structures;
    wherein the semiconductor device comprises a plurality of said transistors surrounded by said inner surrounding structure and by said outer surrounding structure, said conductive structure is free from direct contact of said second epitaxial layer of said substrate, and said outer surrounding structure and said substrate cooperatively constitute a diode that is isolated from said transistors by said inner surrounding structure.

2. The semiconductor device of claim 1, wherein said insulating spacer is formed with an annular groove defined by a groove-defining wall, said conductive structure extending into said annular groove.

3. The semiconductor device of claim 2, wherein said insulating spacer includes a bottom portion formed on and contacting said first epitaxial layer, an inner wall portion that adjoins one of said transistors, and an outer wall portion that is spaced apart from said inner wall portion by said annular groove, a thickness of said bottom portion from said trench-defining wall to said groove-defining wall being not less than a thickness of said inner wall portion from said trench-defining wall to said groove-defining wall.

4. The semiconductor device of claim 3, wherein each of said transistors further includes a gate structure including a dielectric layer that is formed on said upper surface of said second epitaxial layer and that has a thickness in the longitudinal direction, and a conductive layer formed on said dielectric layer oppositely of said second epitaxial layer, the thickness of said inner wall portion being greater than that of said dielectric layer.

5. The semiconductor device of claim 1, wherein said insulating spacer is made of a material selected from silicon oxide, a material having a relatively low dielectric constant, an insulative material, and combinations thereof.

6. The semiconductor device of claim 1, wherein said outer surrounding structure includes a first region and a second region that is formed in and contacts said first region and that has a majority carrier concentration higher than that of said first region.

7. The semiconductor device of claim 1, wherein said outer surrounding structure has a width from an interface between said inner and outer surrounding structures to a side of said outer surrounding structure oppositely of said interface, the width being not less than 1 μm.

8. The semiconductor device of claim 1, wherein said outer surrounding structure is spaced apart from a lateral edge of said second epitaxial layer by a distance not less than 2 μm.

9. The semiconductor device of claim 1, wherein said inner surrounding structure extends through said second epitaxial structure and into said first epitaxial layer.

10. The semiconductor device of claim 1, wherein said annular trench of said inner surrounding structure has a depth that is not less than a thickness of said second epitaxial layer of said substrate.

* * * * *